(12) United States Patent
Liu et al.

(10) Patent No.: US 12,345,746 B2
(45) Date of Patent: Jul. 1, 2025

(54) VOLTAGE METER FOR MEASURING SIGNAL INSIDE INTEGRATED CIRCUIT

(71) Applicant: NOVATEK Microelectronics Corp., Hsin-Chu (TW)

(72) Inventors: Cheng-Yu Liu, Hsinchu (TW); Chiao-Wei Hsiao, Taichung (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 167 days.

(21) Appl. No.: 18/237,886

(22) Filed: Aug. 24, 2023

(65) Prior Publication Data

US 2025/0067781 A1    Feb. 27, 2025

(51) Int. Cl.
| | | |
|---|---|---|
| *G01R 19/10* | (2006.01) | |
| *G01R 19/25* | (2006.01) | |
| *G05F 1/575* | (2006.01) | |
| *H03M 3/00* | (2006.01) | |

(52) U.S. Cl.
CPC ......... *G01R 19/2506* (2013.01); *G01R 19/10* (2013.01); *G01R 19/2513* (2013.01); *G05F 1/575* (2013.01); *H03M 3/30* (2013.01)

(58) Field of Classification Search
CPC .. G01R 21/1331; G01R 21/133; G01R 22/00; G01R 15/09; G01R 22/063; G01R 21/06; G01R 35/04; G01R 19/2506; G01R 15/146; G01R 31/3842; G01R 31/387; G01R 19/00; G01R 29/12; G01R 19/10; G01R 19/25; G01R 31/3835; G01R 35/005; G01R 13/02; G01R 19/145; G01R 19/165; G01R 19/30; G01R 19/0084; G01R 19/14; G01R 27/02; G01R 19/2513; G06F 1/3209; G06F 1/3234; G06F 1/3203; G05F 1/575; H03M 3/30

See application file for complete search history.

(56) References Cited

U.S. PATENT DOCUMENTS

| | | | |
|---|---|---|---|
| 4,197,493 A | | 4/1980 | Juve |
| 4,321,530 A | * | 3/1982 | Kelly ................. G01R 15/125 324/133 |
| 4,716,371 A | * | 12/1987 | Blitshteyn ............. G01R 29/12 324/72 |
| 5,952,820 A | * | 9/1999 | Thrasher ............. G01R 19/155 324/133 |

(Continued)

FOREIGN PATENT DOCUMENTS

| | | |
|---|---|---|
| TW | 202127802 A | 7/2021 |
| WO | 2020/079888 A1 | 4/2020 |

*Primary Examiner* — Vinh P Nguyen
(74) *Attorney, Agent, or Firm* — Winston Hsu

(57) ABSTRACT

A voltage meter includes a sampler, a gain circuit, an accumulator and a feedback circuit. The sampler samples an input signal to generate a series of first signals and a series of second signals. The gain circuit, coupled to the sampler, modifies at least one of the series of first signals and the series of second signals, to generate a series of modified first signals and a series of modified second signals. The accumulator, coupled to the gain circuit, accumulates an operational result of the series of modified first signals and the series of modified second signals, to generate an accumulation result. The feedback circuit, coupled between the accumulator and the sampler, sends a feedback signal back to the sampler according to the accumulation result.

25 Claims, 5 Drawing Sheets

(56) References Cited

U.S. PATENT DOCUMENTS 11,411,569 B2 * 8/2022 Moslehi Bajestan ........................ H03L 7/0816
2008/0079435 A1 4/2008 Williams

* cited by examiner

VOLTAGE METER FOR MEASURING SIGNAL INSIDE INTEGRATED CIRCUIT

BACKGROUND OF THE INVENTION

1. Field of the Invention

The present invention relates to a voltage meter, and more particularly, to a voltage meter for measuring the maximum value and the minimum value of a signal inside an integrated circuit.

2. Description of the Prior Art

In order to determine the quality of a signal inside an integrated circuit (IC), it is requested to measure alternating current (AC) swing on a direct current (DC) signal. The main DC signal is usually accompanied by system noises and large DC offsets that are needed to be measured. Since the signal is noisy, the measurement of transient behavior of the noises and large DC offsets may be complex and require high bandwidth.

SUMMARY OF THE INVENTION

It is therefore an objective of the present invention to provide a novel voltage meter which is capable of measuring the maximum value and the minimum value of a signal, so as to determine the signal quality.

An embodiment of the present invention discloses a voltage meter, which comprises a sampler, a gain circuit, an accumulator and a feedback circuit. The sampler samples an input signal to generate a series of first signals and a series of second signals. The gain circuit, coupled to the sampler, modifies at least one of the series of first signals and the series of second signals, to generate a series of modified first signals and a series of modified second signals. The accumulator, coupled to the gain circuit, accumulates an operational result of the series of modified first signals and the series of modified second signals, to generate an accumulation result. The feedback circuit, coupled between the accumulator and the sampler, sends a feedback signal back to the sampler according to the accumulation result.

Another embodiment of the present invention discloses a voltage control system, which comprises a voltage regulator and a voltage meter. The voltage meter is coupled to an output terminal of the voltage regulator, and comprises a sampler, a gain circuit, an accumulator and a feedback circuit. The sampler samples a voltage signal of the voltage regulator to generate a series of first signals and a series of second signals. The gain circuit, coupled to the sampler, modifies at least one of the series of first signals and the series of second signals, to generate a series of modified first signals and a series of modified second signals. The accumulator, coupled to the gain circuit, accumulates an operational result of the series of modified first signals and the series of modified second signals, to generate an accumulation result. The feedback circuit, coupled between the accumulator and the sampler, sends a feedback signal back to the sampler according to the accumulation result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
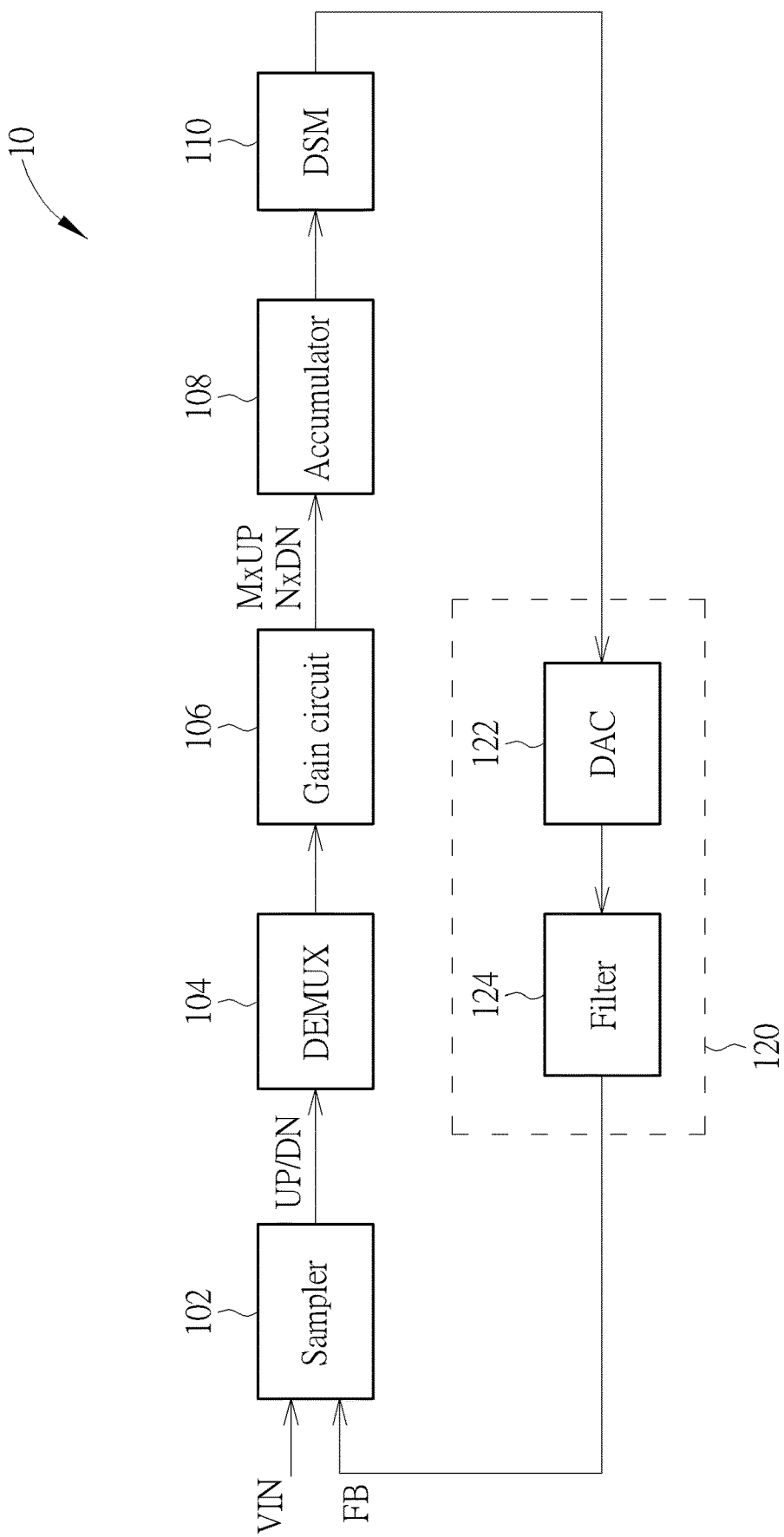
FIG. 1 is a schematic diagram of a voltage meter according to an embodiment of the present invention.

FIG. 1 is a schematic diagram of a voltage meter 10 according to an embodiment of the present invention. The voltage meter 10 includes a sampler 102, a demultiplexer (DEMUX) 104, a gain circuit 106, an accumulator 108, a delta-sigma modulator (DSM) 110 and a feedback circuit 120. The voltage meter 10 may measure the voltage signal on any node inside an integrated circuit (IC), to obtain the maximum value and the minimum value of the voltage over a time period. For example, in a specific node on which the voltage may continuously fluctuate due to noise interference or other reasons, a circuit designer may need to know the range or amplitude of the voltage variation to determine its stability. The voltage meter 10 is able to detect the maximum voltage and the minimum voltage of this node, in order to achieve this purpose.

In the voltage meter 10, the sampler 102 may receive an input signal VIN to generate a series of up signals UP and a series of down signals DN. The received input signal VIN may be a continuous voltage signal, and the sampler 102 may sample and obtain discrete values of the input signal VIN, which may be compared with a feedback signal FB received from the feedback circuit 120 to generate the up signals UP and the down signals DN. In an embodiment, the sampler 102 may be implemented with a strong-arm (SA) latch.

The DEMUX 104, which is coupled between the sampler 102 and the gain circuit 106, may convert the series of up signals UP and the series of down signals DN into a parallel form. Specifically, the sampler 102 may have a high sampling rate up to several gigabits per second. However, the operational speed of the gain circuit 106, the accumulator 108 and the DSM 110 may usually be in the megabit level. Therefore, the DEMUX 104 may down-sample the up signals UP and the down signals DN originally in gigahertz level to a lower frequency such as several hundreds of megahertz, to be adapted to the operational speed of the follow-up circuits. In an embodiment, one sampler may correspond to a plurality of channels, each has a digital processing circuit including a gain circuit, accumulator and DSM. The DEMUX 104 may perform serial-to-parallel conversion to forward each of the up signals UP and the down signals DN to the corresponding channel, to output the up signals UP and the down signals DN in parallel, allowing the up signals UP and the down signals DN to be processed promptly in multiple channels.

The gain circuit 106, which is coupled to the sampler 102 and the DEMUX 104, may modify the series of up signals UP to generate a series of modified up signals (denoted by M×UP in FIG. 1, where M refers to the gain applied to the up signals UP), and/or modify the series of down signals DN to generate a series of modified down signals (denoted by N×DN in FIG. 1, where N refers to the gain applied to the down signals DN). The values of the gains M and N may be set appropriately to achieve a desired purpose. Details of the gain circuit 106 will be narrated later.

The accumulator 108, which is coupled to the gain circuit 106, may accumulate an operational result of the series of modified up signals and the series of modified down signals to generate an accumulation result. More specifically, the accumulator 108 may take each of the modified up signals minus a corresponding one of the modified down signals as the operational result, and accumulate, sum, or integrate the operational result to generate the accumulation result. In such a situation, the accumulation result may be represented by SUM(M×UP−N×DN).

The DSM 110, which is coupled between the accumulator 108 and the feedback circuit 120, may perform noise shaping on the accumulation result. More specifically, the DSM 110 may move the noise component of the accumulation result to a higher frequency. Therefore, the high-frequency noises interfering with the low-frequency signal are pushed to an even higher frequency, so that the noises may be easily filtered out by the filter included in the feedback circuit 120, so as to improve the signal to noise ratio (SNR).

The feedback circuit 120, which is on the feedback path coupled between the DSM 110 and the sampler 102, may include a digital-to-analog converter (DAC) 122 and a filter 124. The DAC 122 may convert the accumulation result into analog form as the feedback signal FB. The DAC 122 may be an inverter-based DAC, which may be implemented as a return-to-zero DAC in order to minimize the impact of non-linearity. The DAC 122 may be of any bit according to system requirements, such as a 6-bit DAC or 10-bit DAC. In an embodiment, in order to simplify the system structure, the DAC 122 may be a 1-bit DAC.

Figure 2A:
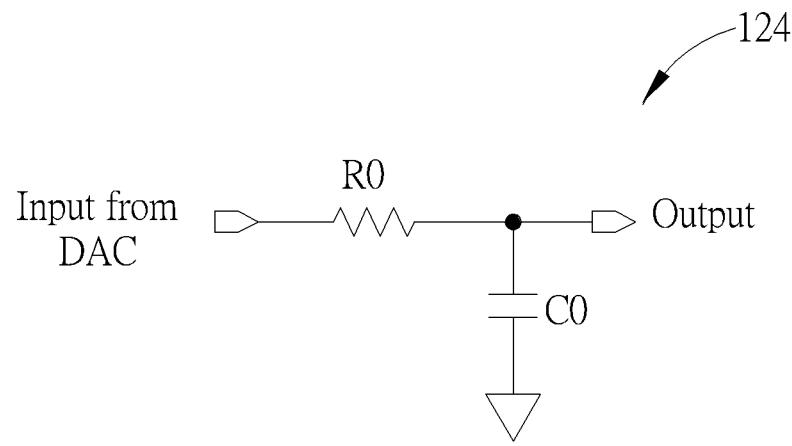
FIG. 2A and FIG. 2B are schematic diagrams of exemplary implementations of the filter.
Figure 2B:
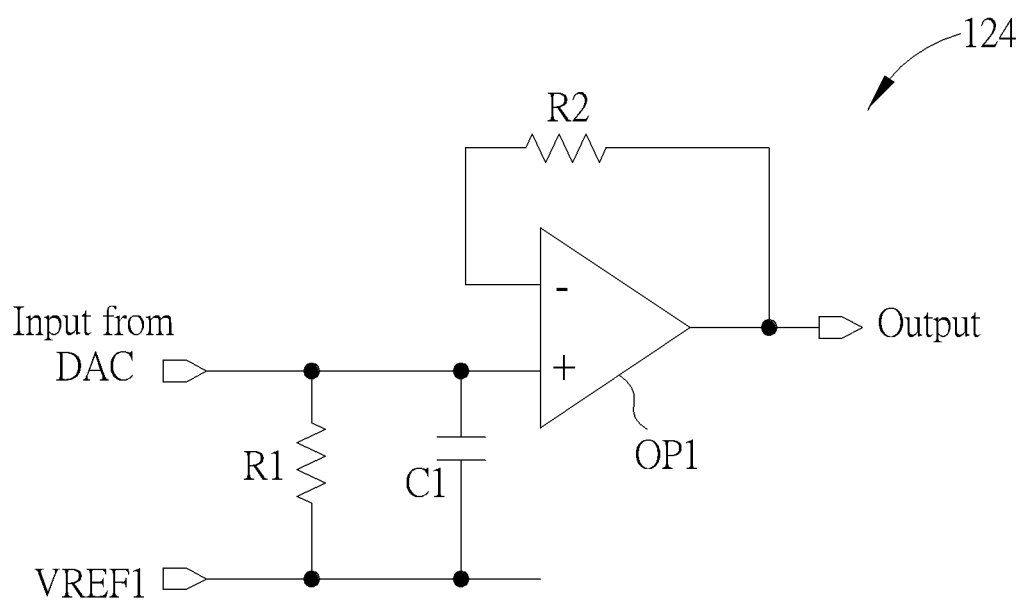

The filter 124 may be a lowpass filter for filtering out the high-frequency noises on the feedback signal FB output by the DAC 122. The noises may include, but not limited to, quantization noises of the DSM 110 and the DAC 122 and the Gaussian noises of the input signal VIN. FIGS. 2A and 2B are schematic diagrams of exemplary implementations of the filter 124. FIG. 2A illustrates a passive filter, which is composed of a resistor R0 and a capacitor C0. FIG. 2B illustrates an active filter, in which an operational amplifier OP1 in addition to a capacitor C1 and resistors R1 and R2 are included. The active filter may be operated by receiving a reference voltage VREF1. Since the active filter includes the operational amplifier OP1 which possesses high input impedance and low output impedance, the active filter may provide a better isolation between its input terminal and output terminal, to achieve superior signal integrity.

As shown in FIG. 1, the feedback signal FB may be sent back to the sampler 102, which may compare the input signal VIN with the feedback signal FB to generate the up signals UP and the down signals. Generally, an up signal UP is generated when a sampled input signal VIN is greater than the corresponding feedback signal FB, and a down signal DN is generated when a sampled input signal VIN is smaller than the corresponding feedback signal FB. In other words, the up signal(s) UP may be generated when the input signal VIN is in an ascending trend, and the down signal(s) DN may be generated when the input signal VIN is in a descending trend.

Figure 3:
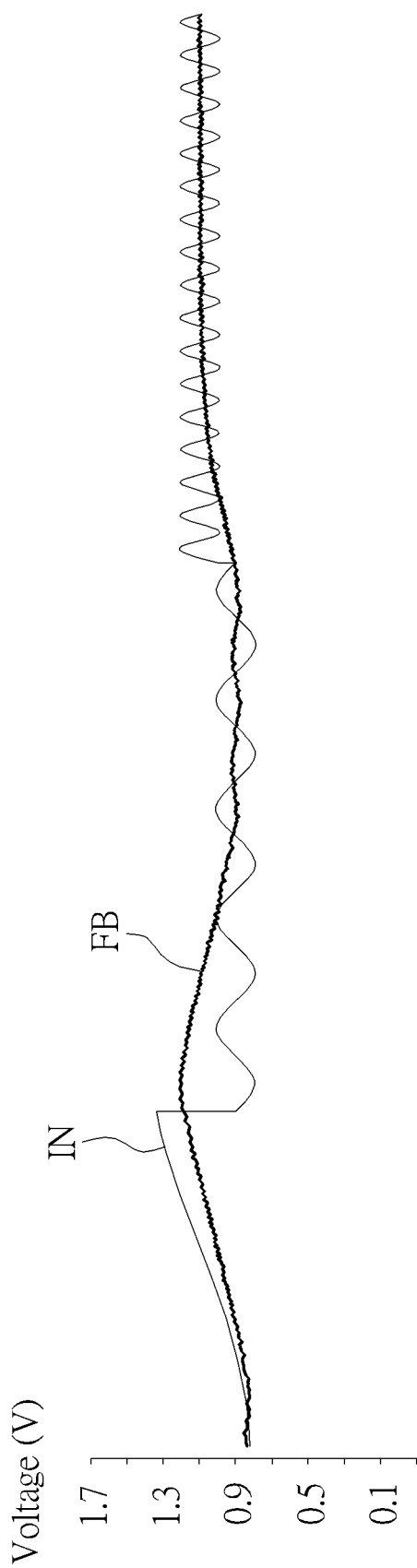
FIG. 3 shows a power signal as the input signal and the corresponding feedback signal generated by the voltage meter.

As mentioned above, the monitored input signal VIN usually has noises; hence, the input signal VIN and the generated up/down signals may have Gaussian distribution, given that the noises are supposed to be Gaussian noises. The accumulator 108, the DSM 110 and the feedback circuit 120 aim at filtering out the Gaussian noises in the input signal VIN to generate the feedback signal FB. In an embodiment, when the gains M and N applied to the up signals UP and the down signals DN are both 1, or when the gain circuit 106 is disabled or omitted and thus the up signals UP and the down signals DN without modification are directly forwarded to the accumulator 108, the generated feedback signal FB may track the mean value of the input signal VIN. The feedback signal FB is a low-frequency signal tracking the noisy high-frequency input signal VIN. FIG. 3 shows a power signal as the input signal VIN and the corresponding feedback signal FB generated by the voltage meter 10. The power signal may have some ripples in the stable state, and the feedback signal FB tracks the mean value of the power signal with a slow variation. In this embodiment, the gains M and N of the gain circuit 106 are equal to 1.

Figure 4:
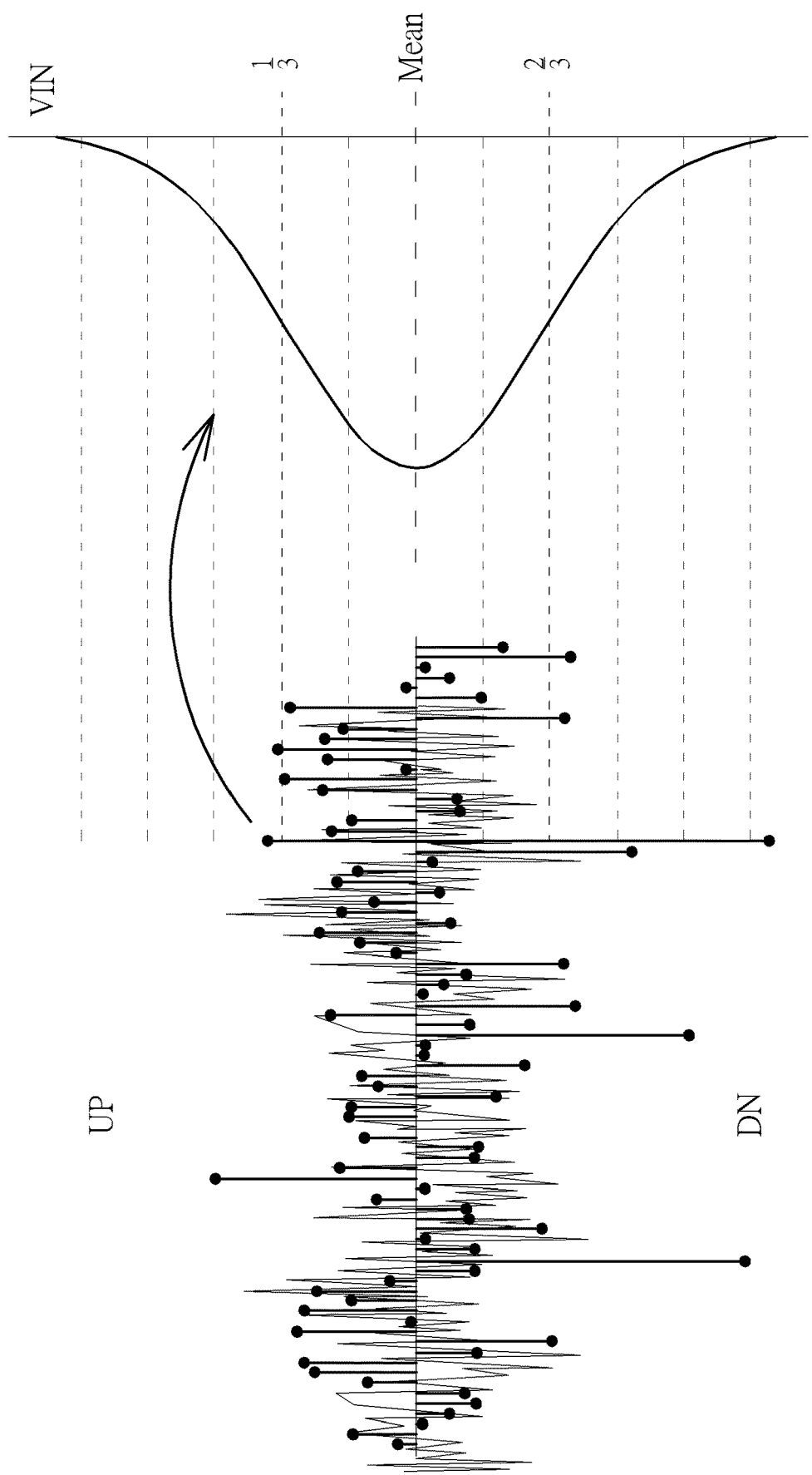
FIG. 4 illustrates a probability density function of the up/down signals which are a series of discrete samples of the input signal.

As mentioned above, the present invention may measure the maximum value and the minimum value of the input signal, which may be realized by using the gain circuit 106. FIG. 4 illustrates a probability density function of the up/down signals which are a series of discrete samples of the input signal VIN. As mentioned above, if the gains M and N are both 1 and thus the accumulator calculates the summation of UP−DN, the feedback signal FB will track the mean value of the input signal VIN. In order to track other statistical values of the input signal VIN, the weighting associated with the gains M and N may be adjusted. For example, as shown in FIG. 4, if the gain M and/or N is/are modified to let M to be twice N (e.g., to calculate SUM (2UP−DN) as the accumulation result), the feedback signal FB will track the value at ⅓ of the probability distribution, which is higher than the mean value. Similarly, if the gain M and/or N is/are modified to let N to be twice M (e.g., to calculate SUM(UP−2DN) as the accumulation result), the feedback signal FB will track the value at ⅔ of the probability distribution, which is lower than the mean value.

In an embodiment, the voltage meter 10 is requested to measure the maximum value of the input signal VIN; hence, the gain M may be set to an extremely large value such as 128 while the gain N may equal 1 or keep at a relatively small value. In such a situation, the feedback signal FB will track the value at $1/129$ of the probability distribution, which means that the feedback signal FB may be substantially at a level smaller than only $1/129$ of the sampled up/down signals. This level approximates to the maximum value of the input signal VIN with an error less than 18, and such a small error is acceptable in most applications.

In the same or another embodiment, the voltage meter 10 is requested to measure the minimum value of the input signal VIN; hence, the gain N may be set to an extremely large value such as 128 while the gain M may equal 1 or keep at a relatively small value. In such a situation, the feedback signal FB will track the value at $128/129$ of the probability distribution, which means that the feedback signal FB may be substantially at a level larger than only $1/129$ of the sampled up/down signals. This level approximates to the minimum value of the input signal VIN with an error less than 18, and such a small error is acceptable in most applications.

Therefore, the gain circuit 106 may multiply the up signals UP by the gain M to generate the modified up signals M×UP, and/or multiply the down signals DN by the gain N to generate the modified down signals N×DN, and then the accumulator 108 accumulates the operational result of each modified up signal minus the corresponding modified down signal to obtain the accumulation result SUM(M×UP−N× DN). In general, the circuit designer may usually need to know the maximum value, the minimum value and the mean value of the input signal to be measured. By adjusting the weighting of the gains applied to up/down signals, the voltage meter of the present invention is allowed to track any level associated with the input signal VIN, such as the maximum value, the minimum value and the mean value. The voltage meter may be deployed along with a circuit block inside the system on a chip (SoC) to monitor the peak voltage and the average voltage of an essential node, in order to determine the signal quality on this node.

In an embodiment, the gain circuit 106 may include a shift register, which may perform multiplication on a digital value by shifting the bit values of the digital value. For example, given a digital signal (which may be an up signal or a down signal) having a value "00010", the shift register may shift the bits leftwards to become "00100" to multiply the digital signal by 2, or shift the bits leftwards to become "01000" to multiply the digital signal by 4. In this manner, it is feasible to multiply an up signal or a down signal by 128 by shifting the signal leftwards by 7 bit positions.

In an embodiment, the gain circuit 106 having the shift registers may be integrated with the DEMUX 104. The DEMUX 104 may serve as a selector for controlling multiple output channels having different shift positions, and choosing a specific output channel to which the up/down signal is forwarded based on the desired weighting (i.e., the gain).

Please note that the present invention aims at providing a novel voltage meter which is capable of measuring the maximum value and the minimum value of a signal. Those skilled in the art may make modifications and alterations accordingly. For example, in the above embodiment, the gain circuit 106 is integrated with the DEMUX 104 to implement the shift register and realize the modification of up/down signals. In another embodiment, the gain circuit 106 may be a stand-alone circuit, or may be integrated with the accumulator 108. In addition, the strong-arm latch is an exemplary implementation of the sampler 102, and it is feasible to use another circuit module having the sampling function to realize the sampler 102.

In an embodiment, the voltage meter may be applied to a voltage regulator, to measure the output voltage of the voltage regulator. Based on the settings of the gain circuit, the voltage meter may measure the maximum value, the minimum value and the mean value of the output voltage over a time period. With the maximum value and the minimum value, the voltage meter may further obtain the peak-to-peak voltage of the regulator output, which may be a metric for representing the signal quality. For example, a smaller peak-to-peak voltage indicates a smaller ripple on the voltage signal, which may represent a better signal quality.

Figure 5:
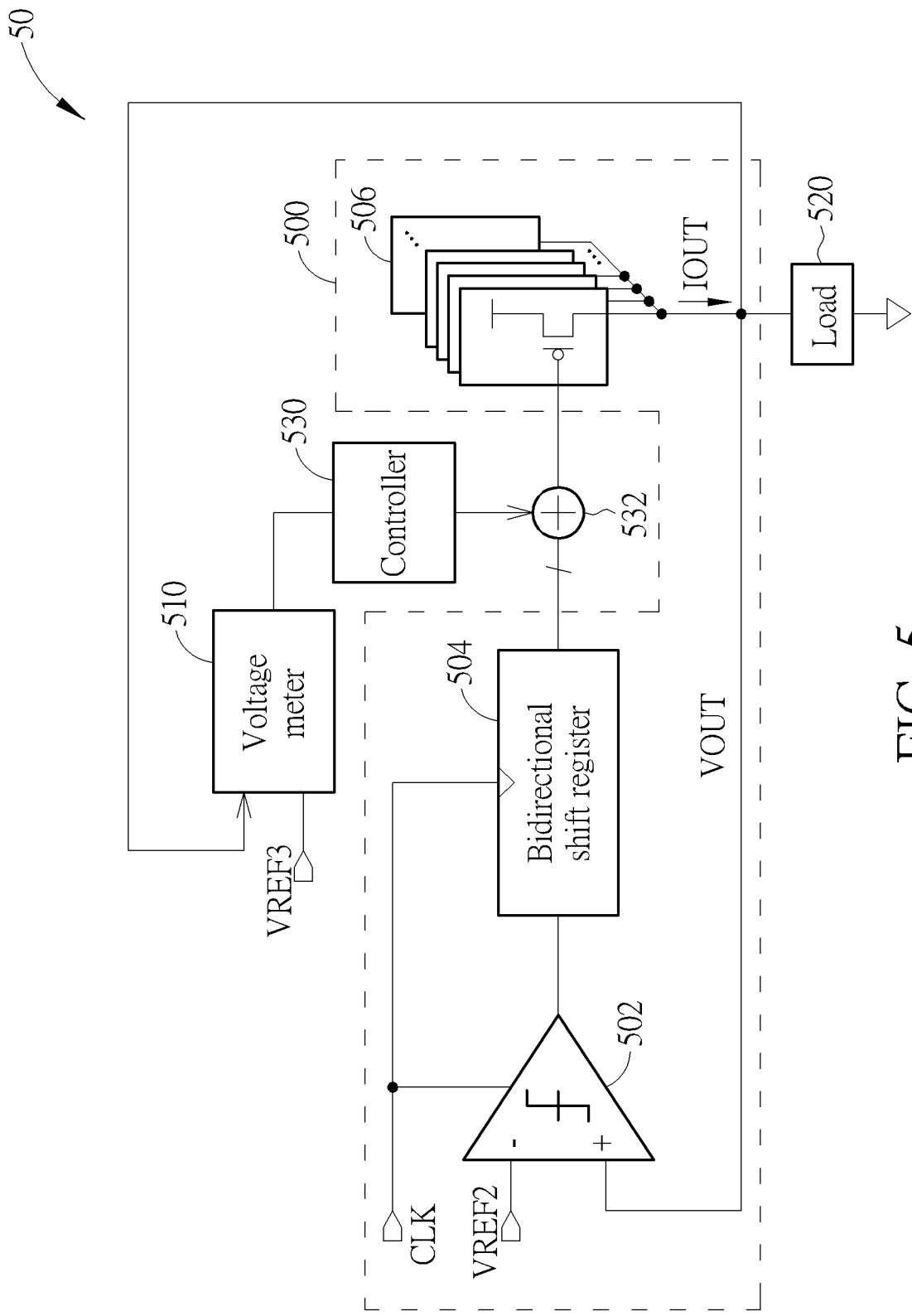
FIG. 5 is a schematic diagram of a voltage control system according to an embodiment of the present invention.

FIG. 5 is a schematic diagram of a voltage control system 50 according to an embodiment of the present invention. The voltage control system 50 includes a voltage regulator 500, a voltage meter 510 and a load 520. The voltage regulator 500 may be a digital low-dropout (LDO) regulator, which includes a comparator 502, a bidirectional shift register 504 and an output transistor array 506. The voltage regulator 500 may output an output voltage VOUT and supply an output current IOUT to the load 520, where the load 520 generally refers to any circuit block that may receive voltage/current supplied by the voltage regulator 500. The voltage meter 510 may have a structure identical to the voltage meter 10 as shown in FIG. 1.

In the voltage regulator 500, the comparator 502 may compare the output voltage VOUT with a reference voltage VREF2. The value of the reference voltage VREF2 may be set according to the output requirements. For example, if the voltage regulator 500 is requested to supply 1.6 V to the load 520, it may receive the reference voltage VREF2 equal to 1.6 V to be tracked by the output voltage VOUT. The bidirectional shift register 504 may control the turn-on status of the output transistor array 506 based on the comparison result of the comparator 502. The operations of the comparator 502 and the bidirectional shift register 504 may be controlled by receiving a clock signal CLK.

The output transistor array 506 serves to output currents (i.e., IOUT) to drive the load 520. The comparison result of the comparator 502 indicates whether the level of the output voltage VOUT is high enough. If the output voltage VOUT is not high enough, which indicates that the output current IOUT may be insufficient, the bidirectional shift register 504 may turn on more transistors in the output transistor array 506, allowing the output transistor array 506 to supply a higher current. On the contrary, if the comparison result of the comparator 502 indicates that the output voltage VOUT is excessively high, the bidirectional shift register 504 may turn on fewer transistors in the output transistor array 506 to supply a lower current. Finally, the output voltage VOUT may be locked on the level of the reference voltage VREF2.

In this embodiment, the voltage meter 510 may be coupled to the output terminal of the voltage regulator 500 to measure the output voltage VOUT, and may also be coupled to the control terminal of the output transistor array 506 through a controller 530 with an adder 532. Under the normal output voltage VOUT of the voltage regulator 500, the output current IOUT may be on a normal level (e.g., 4 mA). If the output current IOUT slightly falls (e.g., decreasing to 3.6 mA), the output voltage VOUT might still be at its normal level but have large ripples. The feedback mechanism of the voltage regulator 500 may not detect this situation and may still consider that the loop is stable. In such a situation, the voltage meter 510 may detect the maximum value and the minimum value of the output voltage VOUT, to determine that the ripples of the output voltage VOUT become larger and the system becomes unstable. Through the controller 530 and the adder 532, the voltage meter 510 may provide more precise control and calibration of the output current IOUT. In other words, the voltage meter 510 may control the voltage regulator 500 to output sufficient currents to keep the output voltage VOUT, reduce the ripples, and improve the system stability.

In an embodiment, the voltage meter 510 may receive a reference voltage VREF3 for operations. The reference voltage VREF3 for the voltage meter 510 may be identical to or different from the reference voltage VREF2 for the comparator 502. In an embodiment, the reference voltage VREF3 may be represented as a digital code to be received by the accumulator of the voltage meter 510, to be utilized as a reference code for shifting the detected voltage.

The conventional voltage meter may usually measure a voltage signal by monitoring the voltage swing in high frequency. This approach requires a high bandwidth and complex circuitry. In contrast, the voltage meter of the present invention does not need to know the overall alternating current (AC) behavior of the voltage signal; instead, it may only measure the maximum and minimum values which are concerned by a circuit designer. These extreme values may be easily obtained by modifying the delta-sigma control loop to track a high level approximating to the maximum value and/or a low level approximating to the minimum value.

Under similar power consumption and supply voltage, in the embodiments of the present invention, the resolution of measured voltage may be decreased to be 1 mV by applying the DSM operations, while the resolution of other conventional approaches may range from 4 mV to 20 mV. The present invention may also achieve a superior effective number of bits (ENOB) and low area with the usage of 1-bit DAC. Therefore, the voltage meter of the present invention has sufficient competitiveness in this art.

To sum up, the present invention provides a novel voltage meter capable of measuring the maximum value and the minimum value of a signal. The voltage meter may process the input signal by using a feedback loop consisting of an accumulator, DSM, DAC and filter, where the feedback signal will track the input signal in an appropriate manner. A sampler such as an SA latch may sample the input signal to generate a series of up signals and a series of down signals. By accumulating the operational result of the up signals minus the down signals without modification, the feedback signal may track the mean value of the input signal. The weighting/ratio between the up signals and the down signals may be modified to realize other tracking schemes. In an embodiment, the up signals may be multiplied by an extremely large value while the down signals may keep unchanged, and thus the feedback signal will track a level approximating to the maximum value of the input signal. In the same or another embodiment, the down signals may be multiplied by an extremely large value while the up signals may keep unchanged, and thus the feedback signal will track a level approximating to the minimum value of the input signal. As a result, the voltage meter is able to measure the peak-to-peak voltage of a signal, so as to determine the ripple magnitude and thereby determine the signal quality. The voltage meter of the present invention is applicable to any circuit block inside the SoC to monitor the peak voltage and the average voltage of an essential node. In an embodiment, the voltage meter may be applied to measure the output voltage of a voltage regulator such as a digital LDO regulator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage meter, comprising:
   a sampler to sample an input signal to generate a series of first signals and a series of second signals;
   a gain circuit, coupled to the sampler, to modify at least one of the series of first signals and the series of second signals, to generate a series of modified first signals and a series of modified second signals;
   an accumulator, coupled to the gain circuit, to accumulate an operational result of the series of modified first signals and the series of modified second signals, to generate an accumulation result; and
   a feedback circuit, coupled between the accumulator and the sampler, to send a feedback signal back to the sampler according to the accumulation result.

2. The voltage meter of claim 1, further comprising:
   a demultiplexer, coupled between the sampler and the gain circuit, to convert the series of first signals and the series of second signals into a parallel form.

3. The voltage meter of claim 1, wherein the sampler comprises a strong-arm (SA) latch.

4. The voltage meter of claim 1, further comprising:
   a delta-sigma modulator (DSM), coupled between the accumulator and the feedback circuit, to perform noise shaping on the accumulation result.

5. The voltage meter of claim 1, wherein the feedback circuit comprises:
   a digital-to-analog converter (DAC) to convert the accumulation result into the feedback signal; and
   a filter, coupled to the DAC, to filter out noises on the feedback signal.

6. The voltage meter of claim 5, wherein the DAC is a 1-bit DAC.

7. The voltage meter of claim 5, wherein the filter is a passive filter or an active filter.

8. The voltage meter of claim 1, wherein the accumulator obtains the operational result by taking each of the series of modified first signals minus a corresponding one of the series of modified second signals, and sums the operational result to generate the accumulation result.

9. The voltage meter of claim 1, wherein the gain circuit modifies the at least one of the series of first signals and the series of second signals by performing at least one of the following steps:
   multiplying the series of first signals by a first gain to generate the series of modified first signals; and
   multiplying the series of second signals by a second gain to generate the series of modified second signals.

10. The voltage meter of claim 9, wherein the first gain is an extremely large value and the second gain equals 1.

11. The voltage meter of claim 9, wherein the first gain equals 1 and the second gain is an extremely large value.

12. The voltage meter of claim 1, wherein the series of first signals comprise a series of up signals and each of the series of up signals is generated when the sampled input signal is greater than the feedback signal, and the series of second signals comprise a series of down signals and each of the series of down signals is generated when the sampled input signal is smaller than the feedback signal.

13. A voltage control system, comprising:
    a voltage regulator; and
    a voltage meter, coupled to an output terminal of the voltage regulator, the voltage meter comprising:
        a sampler to sample a voltage signal of the voltage regulator to generate a series of first signals and a series of second signals;
        a gain circuit, coupled to the sampler, to modify at least one of the series of first signals and the series of second signals, to generate a series of modified first signals and a series of modified second signals;
        an accumulator, coupled to the gain circuit, to accumulate an operational result of the series of modified first signals and the series of modified second signals, to generate an accumulation result; and
        a feedback circuit, coupled between the accumulator and the sampler, to send a feedback signal back to the sampler according to the accumulation result.

14. The voltage control system of claim 13, wherein the voltage meter further comprises:
    a demultiplexer, coupled between the sampler and the gain circuit, to convert the series of first signals and the series of second signals into a parallel form.

15. The voltage control system of claim 13, wherein the sampler comprises a strong-arm (SA) latch.

16. The voltage control system of claim 13, wherein the voltage meter further comprises:
a delta-sigma modulator (DSM), coupled between the accumulator and the feedback circuit, to perform noise shaping on the accumulation result.

17. The voltage control system of claim 13, wherein the feedback circuit comprises:
a digital-to-analog converter (DAC) to convert the accumulation result into the feedback signal; and
a filter, coupled to the DAC, to filter out noises on the feedback signal.

18. The voltage control system of claim 17, wherein the DAC is a 1-bit DAC.

19. The voltage control system of claim 17, wherein the filter is a passive filter or an active filter.

20. The voltage control system of claim 13, wherein the accumulator obtains the operational result by taking each of the series of modified first signals minus a corresponding one of the series of modified second signals, and sums the operational result to generate the accumulation result.

21. The voltage control system of claim 13, wherein the gain circuit modifies the at least one of the series of first signals and the series of second signals by performing at least one of the following steps:
multiplying the series of first signals by a first gain to generate the series of modified first signals; and
multiplying the series of second signals by a second gain to generate the series of modified second signals.

22. The voltage control system of claim 21, wherein the first gain is an extremely large value and the second gain equals 1.

23. The voltage control system of claim 21, wherein the first gain equals 1 and the second gain is an extremely large value.

24. The voltage control system of claim 13, wherein the series of first signals comprise a series of up signals and each of the series of up signals is generated when the sampled input signal is greater than the feedback signal, and the series of second signals comprise a series of down signals and each of the series of down signals is generated when the sampled input signal is smaller than the feedback signal.

25. The voltage control system of claim 13, wherein the voltage regulator is a digital low-dropout (LDO) regulator.

* * * * *